(12) United States Patent
Karalar (10) Patent No.: US 9,484,925 B2
(45) Date of Patent: Nov. 1, 2016

(54) PROGRAMMABLE DIVIDER

(75) Inventor: Tufan Coskun Karalar, Albany, CA (US)

(73) Assignee: Silicon Laboratories Inc., Austin, TX (US)

(*) Notice: Subject to any disclaimer, the term of this patent is extended or adjusted under 35 U.S.C. 154(b) by 840 days.

(21) Appl. No.: 13/250,036

(22) Filed: Sep. 30, 2011

(65) Prior Publication Data
US 2013/0082748 A1 Apr. 4, 2013

(51) Int. Cl.
*H03K 21/02* (2006.01)

(52) U.S. Cl.
CPC .................... *H03K 21/023* (2013.01)

(58) Field of Classification Search
USPC .......................................... 327/115, 117, 118
See application file for complete search history.

(56) References Cited

U.S. PATENT DOCUMENTS

2008/0042699 A1* 2/2008 Narathong et al. ........... 327/117

OTHER PUBLICATIONS

Cicero Vaucher et al., A Wide-Band Tuning System for Fully Integrated Satellite Receivers, IEEE Journal of Solid-State Circuits, vol. 33, No. 7, Jul. 1998, pp. 987-997.
Cicero Vaucher et al., A Family of Low-Power Truly Modular Programmable Dividers in Standard 0.35-μm CMOS Technology, IEEE Journal of Solid-State Circuits, vol. 35, No. 7, Jul. 2000, pp. 1039-1045.
Mike Curtin et al., "Phase Locked Loops for High-Frequency Receivers and Transmitters—Part 3," Analog Dialogue 33-7 (1999), pp. 18-21.

* cited by examiner

*Primary Examiner* — John Poos
(74) *Attorney, Agent, or Firm* — Trop Pruner & Hu, P.C.

(57) ABSTRACT

A technique includes controlling a modulus of a programmable divider, including selectively activating and deactivating cells of the divider. The activation for at least one of the cells includes configuring an output signal of the cell to exhibit a predetermined signal state when the cell transitions from a deactivated state to an activated state.

17 Claims, 7 Drawing Sheets

PROGRAMMABLE DIVIDER

BACKGROUND

A frequency prescalar, or divider, typically is used for purposes of dividing the frequency of a signal, such as a clock signal, in an electronic system. A simple frequency divider may be constructed from a ring counter, which is a circular shift register. Such a frequency divider divides the input clock frequency by a fixed divisor, or modulus, to produce the divided frequency output signal. However, considerably more complex frequency dividers may be employed for purposes of generating relatively closely-spaced frequencies in a receiver that processes relatively high frequency signals, for example. For example, a dual modulus frequency divider employs two frequency divisors, or moduli, which allows the divider to be switched from one modulus to another using a control signal.

SUMMARY

In an embodiment, a technique includes controlling a modulus of a programmable divider, including selectively activating and deactivating cells of the divider. The activation for at least one of the cells includes configuring an output signal of the cell to exhibit a predetermined signal state when the cell transitions from a deactivated state to an activated state.

In another embodiment, an apparatus includes a programmable divider and a controller. The programmable divider includes divider cells, where at least a given divider cell of the divider cells is adapted to be selectively activated and deactivated in synchronization with a first clock signal to program a modulus of the programmable divider. The controller, in response to a given divider cell transitioning from a deactivated state to an activated state, retimes a modulus control signal that is provided by the given divider cell from being synchronized to the first clock signal to being synchronized to a second clock signal.

In yet another embodiment, an apparatus includes a programmable divider and a controller. The programmable divider includes divider cells, where at least a subset of the divider cells are adapted to be selectively activated and deactivated to program a modulus of the programmable divider. The controller configures an output signal of at least one of the divider cells to exhibit a predetermined signal state when the cell transitions from a deactivated state to an activated state.

Advantages and other features disclosed herein will become apparent from the following drawing, description and claims.

DETAILED DESCRIPTION

Figure 1:
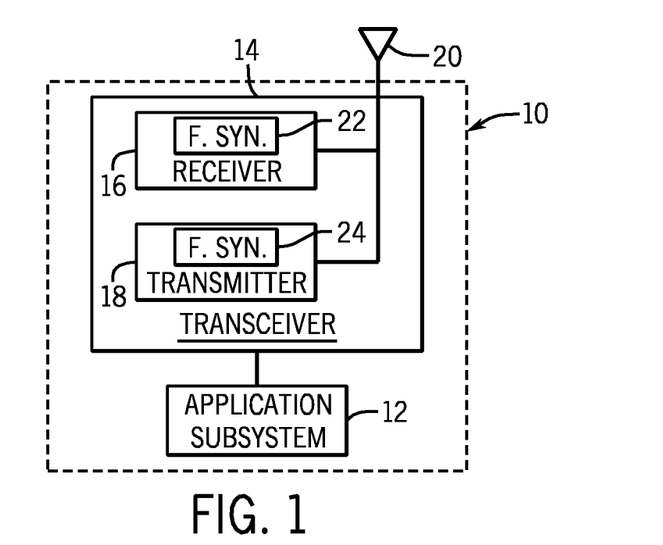
FIG. 1 is a schematic diagram of a wireless device according to an embodiment.

Referring to FIG. 1, a wireless device 10 may be used in a number of different applications for purposes of communicating data over a wireless link. As non-limiting examples, the wireless device 10 may be a personal computer (PC) peripheral; a wireless toy; a remote keyless entry; an industrial control; a home automation controller, sensor or slave device; a sensor network; etc. The wireless device 10 includes an application subsystem 12, which tailors the wireless device 10 for its specific application and may, for example, form a user interface for the device 10. In general, the application subsystem 12 performs various application processing tasks relating to the application in which the wireless device 10 is employed, and these tasks may involve communicating data to a transceiver 14 of the wireless device 10 to be transmitted over a wireless link and receiving data from the transceiver 14, which was received from the wireless link. It is noted that in other exemplary embodiments, the wireless device 10 may only transmit data and thus, not include a receiver; and in other exemplary embodiments, the wireless device 10 may only receive data and thus, not include the transmitter 18. Thus, many variations are contemplated and are within the scope of the appended claims.

The transceiver 14 for the exemplary embodiment depicted in FIG. 1 includes a transmitter 18 that is coupled to an antenna 20 for purposes of transmitting data over the wireless link. In this manner, the transmitter 18 modulates a carrier signal with data to be transmitted and provides the resulted modulated carrier signal to the antenna 20, which radiates electromagnetic energy in response to the signal to transmit the data over the wireless link. The transceiver 14 for the embodiment depicted in FIG. 1 also includes a receiver 16, which is coupled to the antenna 20 for purposes of receiving a modulated carrier signal that is indicative of data that is received from the wireless link. The receiver 16 demodulates the modulated carrier signal to recover the transmitted data and provides this data to the application subsystem 12.

In accordance with other exemplary embodiments, the receiver 16 and the transmitter 18 may be coupled to separate antennas of the wireless device 10. Moreover, in accordance with some exemplary embodiments, the wireless device 10 may include multiple antennas 20 that the wireless device 10 selectively couples to the transmitter 18, depending on one of multiple transmission frequency bands that may be selected for the communication over the wireless link. In a similar manner, in accordance with some exemplary embodiments, the wireless device 10 may include multiple antennas 20 that the wireless device 10 selectively couples to the receiver 16, depending on one of multiple transmission frequency bands that may be selected for communication over the wireless link.

As depicted in FIG. 1, the receiver 16 and transmitter 18 may include frequency synthesizers 22 and 24, respectively, for purposes of generating periodic signals at desired frequencies. For example, these signals may be local oscillator signals used for purposes of tuning the receiver 16 and transmitter 18 to desired channel frequencies.

In accordance with other exemplary embodiments, the frequency synthesizer may be used in an electronic device, other than a wireless device. Thus, many variations are contemplated, which are within the scope of the appended claims.

Figure 2:
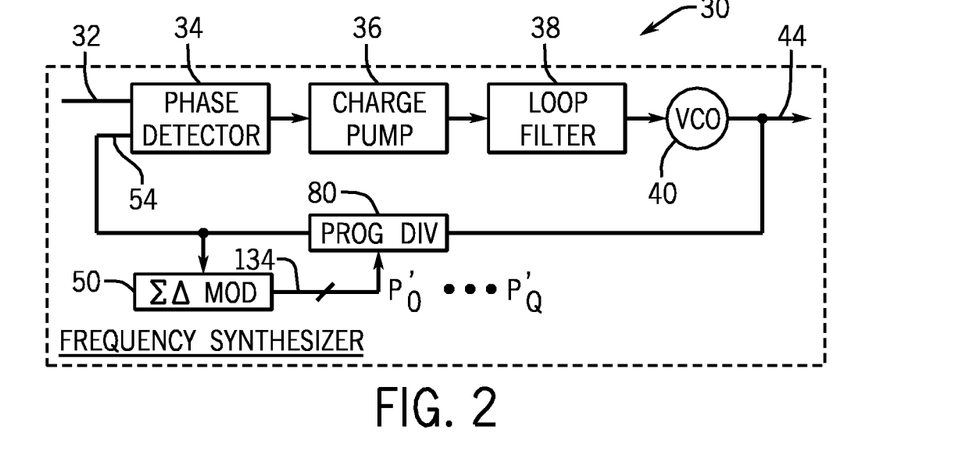
FIG. 2 is a schematic diagram of a frequency synthesizer of a transceiver of FIG. 1 according to an embodiment.

As a non-limiting example, the frequency synthesizer 22 or 24 may have an architecture similar to the architecture of a frequency synthesizer 30 that is depicted in FIG. 2. Referring to FIG. 2, the frequency synthesizer 30 synchronizes, or locks, the frequency of an output clock signal (provided at an output terminal 44) with a reference clock signal (received at an input terminal 32). This locking occurs by controlling a voltage controlled oscillator (VCO) 40, which provides the output clock signal. In this manner, a phase detector 34 receives a clock signal from a feedback loop of the synthesizer 30 (at a reference terminal 54) and compares the feedback signal with the reference clock signal. As a result of this comparison, the phase detector 34 generates a control signal to drive a charge pump 36. The resulting signal from the charge pump 36 is filtered by a loop filter 38, which results in a signal that controls the frequency of the VCO 40.

As depicted in FIG. 2, the frequency synthesizer 30 includes a modular programmable frequency divider 80 (herein called the "programmable frequency divider 80" or the "frequency divider 80"). It is noted that although the programmable frequency divider 80 is disclosed herein as being a component of the frequency synthesizer 30, the programmable frequency divider 80 may be used in other frequency synthesizers having different architectures and may be used, in general, in electronic circuits other than frequency synthesizers. Thus, many variations are contemplated, which are within the scope of the appended claims.

The divisor, or modulus, of the programmable frequency divider 80, is not fixed, but rather, the modulus is periodically programmed, or updated, by a sigma-delta modulator 50 of the frequency synthesizer 30. In this manner, the modulator 50 furnishes Q+1 programming signals (the programming signals "$P'_0 \ldots P'_Q$" being shown in FIG. 2) to programming input terminals 134 of the programmable divider 80, where "Q" is an integer, for purposes of programming the modulus of the programmable divider 80. In this manner, for this notation, the programming signals are indexed by significance, such that the $P_0$ programming signal corresponds to the least significant signal, and the $P_Q$ programming signal corresponds to the most significant signal, for the exemplary embodiments that are disclosed herein.

The modulator 50 updates the modulus of the programmable divider 80 on each cycle of the reference clock signal. As a result, any transient errors that are introduced due to each programming change may significantly affect the programmed modulus, as the changes occur relatively frequently at the frequency of the reference clock signal. Systems and techniques are disclosed herein for purposes of regulating the programmable frequency divider's response to the programming for purposes of minimizing the impact of, if not preventing, any such transient errors for purposes of preserving the desired modulus for the programmable divider 80.

Figure 3:
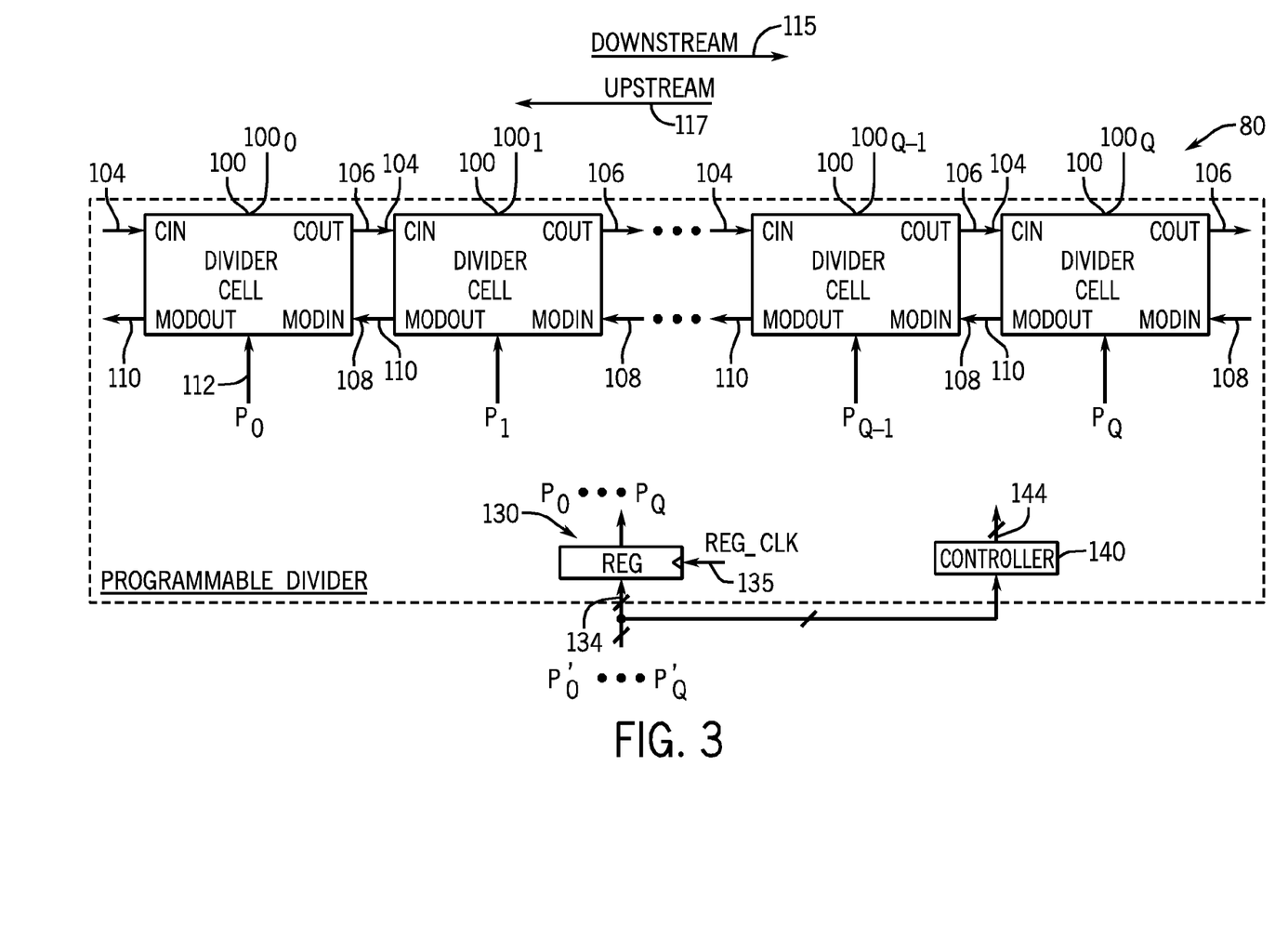
FIG. 3 is a schematic diagram of a modular programmable divider of FIG. 2 according to an embodiment.

Referring to FIG. 3, as a more specific example, the programmable frequency divider 80 may include a cascaded chain of Q+1 fractional divider cells 100 (cells $100_0$, $100_1, \ldots 100_{Q-1}, 100_Q$ being depicted as examples in FIG. 3). In general, assuming a given fractional divider cell 100 is active, the divider cell 100 divides the frequency of an input clock signal (received at input clock terminal 104 of the fractional divider cell 100) to produce a corresponding divided frequency output clock signal (provided at an output clock terminal 106 of the fractional divider cell 100), which propagates "down" (in a downstream direction 115) the cascaded chain of fractional divider cells 100 and is provided to the next input clock terminal 104 of the adjacent, or next, fractional divider cell 100 in the chain. The frequencies of the output clock signals provided by the fractional divider cells 100 become progressively smaller in the downstream direction 115. Therefore, for the example that is depicted in FIG. 3, the fractional divider cell $100_Q$ provides the lowest frequency output clock signal relative to the other fractional divider cells $100_0$ to $100_{Q-1}$.

The fractional divider cell 100 is constructed to divide by either a first modulus (two, for example), or a second modulus (three, for example), depending on the particular state of a programming signal that is provided to an input programming terminal 112 of the divider cell 100. For the example that is depicted in FIG. 3, the fractional divider cells $100_0$ to $100_Q$ receive programming signals $P_0$ to $P_Q$, respectively, which are latched versions of the programming signals $P'_0$ to $P'_Q$, respectively; and as an example, a given programming signal may either be asserted (driven to a logic one value, for example) or de-asserted (driven to a logic zero value, for example). As a non-limiting example, the fractional divider cells 100 may be "⅔" fractional divider cells, which means that the fractional divider cells 100 are constructed to divide either by two or three, as configured by the programming signals.

If the programming signal received by a given fractional divider cell 100 at its input programming terminal 112 is asserted (driven to a logic one state, for example), the fractional divider cell 100 divides by the first modulus until a modulus control signal (received at a input modulus control terminal 108) of the cell 100 is asserted. This asserted state of the modulus control signal causes the fractional divider cell 100 to divide by the second modulus once during the cell's division period. The asserted state of the modulus control signal propagates in the upstream direction 117 through the other fractional divider cells 100 of the cascaded chain via the input modulus control signal terminals 108 and output modulus control signal terminals 110 to cause the other fractional divider cells 100 to divide by the second modulus (when programmed to do so) or during the cell's division period.

More specifically, though the use of the modulus control signal, the programmable frequency divider 80 operates as follows. One time during its division period, the last fractional divider cell 100 in the cascaded chain asserts the modulus control signal at its terminal 110. For example, assuming that all of the fractional divider cells $100_0$ to $100_Q$ are active, the fractional divider cell $100_Q$ asserts the modulus control signal at its output modulus control signal terminal 110, once during the division period of the fractional divider cell $100_Q$. The asserted modulus control signal state is received at the input terminal 108 of the cell $100_{Q-1}$ and propagates in the upstream direction 117 through the reset of the cascaded chain of fractional divider cells 100. Along its path, the asserted state is re-clocked by each fractional divider cell 100.

Until a given fractional divider cell 100 receives the asserted modulus control signal state, the fractional divider cell 100 divides by the first modulus (two, for example). However, when a fractional divider cell 100 receives the asserted modulus control signal state, the cell 100 divides by the second modulus (three, for example) if the programming signal that is received by the cell 100 at its terminal 112 is asserted (driven to a logic one value, as a non-limiting example). By dividing by the second modulus, an extra period of the cell's input clock signal is added to the period of the fractional divider cell's output clock signal, thereby effectively establishing a modulus for the fractional divider cell 100 as a ratio of the first modulus divided by the second modulus.

The modulus control signal received at the input modulus control signal terminal 108 of the last fractional divider cell 100 of the cascaded chain is always asserted (coupled to a logic one voltage, for example), which causes the last fractional divider cell 100 to assert the modulus control signal at its output terminal 110 once every division period of the cell 100. For example, assuming that FIG. 3 depicts the entire active cascaded chain, the fractional divider cell $100_Q$ is the last cell 100 in the cascaded chain; and for this example, the input modulus control signal terminal 108 of the cell $100_Q$ is coupled to a logic one voltage, which causes the fractional divider cell $100_Q$ to assert the modulus control signal provided at the output modulus control signal terminal 110 once every division period of the fractional divider cell $100_Q$. Continuing the example, the fractional divider cell $100_Q$ subsequently de-asserts the modulus control signal provided at its output terminal 110 and repeats the process during the next division cycle. The asserted "pulse" propagates upstream through the other fractional divider cells 100.

By controlling the programming signals for the fractional divider cells 100, the sigma delta modulator 50 (see FIG. 2) may change the overall modulus for the programmable frequency divider 80 once per cycle of the reference input clock signal of the frequency synthesizer 30. To effect this change, the modulator 50 updates the programming signals (programming signals $P'_0$ to $P'_Q$ being depicted in FIG. 3) that the modulator 50 provides via lines 134 to a register 130 of the programmable frequency divider 80. The corresponding $P_0$ to $P_Q$ programming signals are provided to the fractional divider cells 100 of the programmable frequency divider 80 in synchronization with a clock signal (called the "REG_CLK clock signal in FIG. 3) that is provided at an input clock terminal 135 of the register 130. As a non-limiting example, the register 130 may update the $P_0$ to $P_Q$ programming signals in synchronization with the negative going, or falling, edges of the REG_CLK clock signal.

Figure 4:
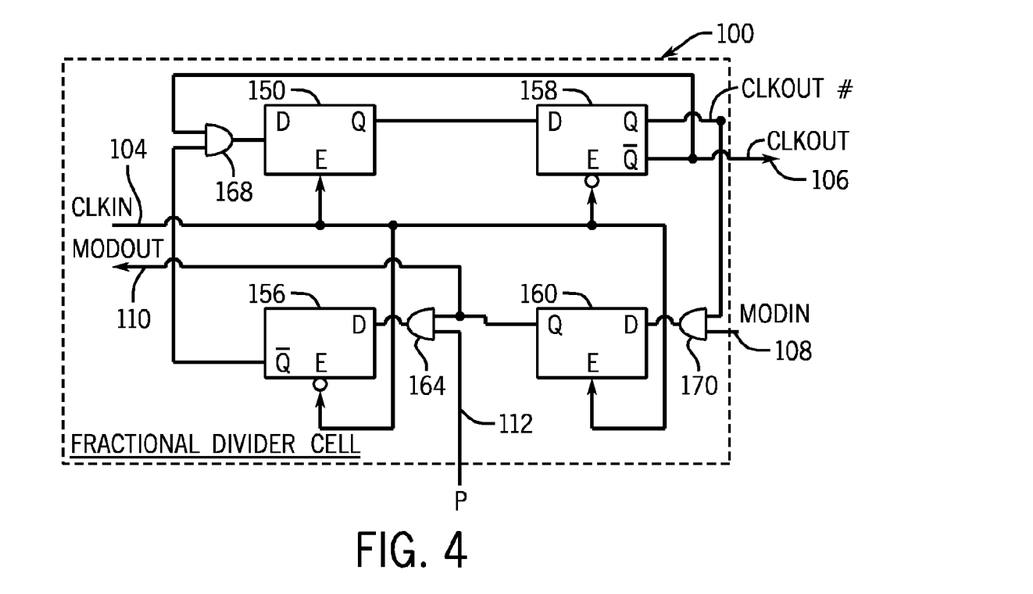
FIG. 4 is a schematic diagram of a fractional divider cell of the modular programmable divider of FIG. 3 according to an embodiment.

FIG. 4 depicts an exemplary architecture for the fractional divider cell 100. For this architecture, the following relationships exist between edges of the input clock signal (called "CLKIN" in FIG. 4) received at the input clock terminal 104 of the fractional divider cell 100 and state changes in the output clock signal (called "CLKOUT" in FIG. 4) provided at the output clock terminal 106, the output modulus control signal (called "MODOUT" in FIG. 4) provided at the output modulus control signal terminal 110 and the input modulus control signal (called "MODIN" in FIG. 4) provided at the input modulus control signal terminal 108: the CLKOUT output clock signal changes on the negative going, or falling, edge of the CLKIN input clock signal; the MODOUT output modulus control signal changes on the positive going, or rising, edge of the CLKIN input clock signal; and the MODIN input modulus control signal changes on the falling edge of the CLKIN input clock signal.

It is noted that these relationships between the signals of the fractional divider cell 100 and the CLKIN clock signal are provided merely as an example for the following discussion, as the signals may be synchronized to different edges of the CLKIN input clock signal, in accordance with other embodiments. For example, in accordance with other embodiments, the CLKOUT output clock signal may change on the rising edges of the CLKIN input clock signal, the MODOUT output modulus control signal may change on the falling edges of the CLKIN input clock signal and the MODIN input modulus control signal may change on the rising edges of the CLKIN input clock signal. Thus, many variations are contemplated, which are within the scope of the appended claims.

For the exemplary architecture that is depicted in FIG. 4, the fractional divider cell 100 has four D-type latches 150, 156, 158 and 160. The enable input of the latch 150 receives the CLK input clock signal; and the enable input of the latch 158 receives the inverted CLKIN input clock signal. The inverting output terminal of the latch 158 provides the CLKOUT output clock signal. When the programming signal (represented by "P" in FIG. 4) for the fractional divider cell 100 is de-asserted (driven to a logic zero value, for example), the fractional cell divider 100 divides by two, as the divider 100 is configured as a divide-by-two ring counter: the input terminal of the latch 150 is coupled to the inverting output terminal of the latch 158, with the non-inverting output and input terminals of the latches 150 and 158, respectively, being coupled together.

However, when the P programming control signal is asserted, the fractional divider cell 100 adds an extra cycle for each division period. As long as the MODIN input modulus control signal is de-asserted, the fractional divider cell 100 functions as divide-by-two ring counter. However, when the MODIN input modulus control signal is asserted, the fractional divider cell 100 adds another cycle to the division period. The addition of the extra cycle is controlled by the latches 156 and 160; an AND gate 164; an AND gate 168; and an AND gate 170. In the manner, the AND gate 170 receives the CLKOUT clock signal and the MODIN input modulus control signal; and the output terminal of the AND gate 170 is coupled to the input terminal of the latch 160. The enable input terminal of the latch 160 is coupled to the CLKIN input clock signal. An output terminal of the AND gate 164 is coupled to the non-inverting output terminal of the latch 160, and another input terminal of the AND gate 164 is coupled to the programming input signal terminal 112. The output terminal of the AND gate 164 is coupled to the signal input terminal of the latch 156.

The enable input terminal of the latch 156 receives the inverted CLKIN input clock signal. An input terminal of the AND gate 168 is coupled to the inverting output terminal of the latch 156, and another input terminal of the AND gate 168 receives the inverted output signal from the latch 158. The output terminal of the AND gate 168 is coupled to the input terminal of the latch 150. Due to this arrangement, when the P signal is asserted, the fractional divider cell 100 adds an additional CLKIN period to the CLKOUT period once every period of the CLKOUT period in response to the assertion of the MODIN input modulus control signal.

Referring back to FIG. 3, for purposes of extending the division range of the programmable divider 80, in accordance with embodiments disclosed herein, certain programming signals may be used to selectively activate and deactivate certain fractional divider cells 100. In this manner, in accordance with some embodiments, a given number of the least significant fractional divider cells 100 may always be activated, and the programming signals for these always active fractional divider cells may be selectively asserted and de-asserted to control the moduli for these cells 100 for purposes of regulating the overall modulus for the programmable divider 80. In addition to these always active fractional divider cells 100, the remaining most significant fractional divider cells 100 may be selectively activated and de-activated using the programming signals.

For example, fractional divider cells $100_0$ to $100_M$ (where M<Q) may be always active, and whether or not these cells 100 divide by one or both moduli is controlled by the respective P programming signals received by these cells 100. The fractional divider cells $100_{M+1}$ to $100_Q$, in turn, are selectively activated and de-activated. In general, when a given fractional divider cell 100 is de-activated, all downstream fractional divider cells 100 (i.e., the fractional divider cells 100 to the right) are effectively de-activated as well. Thus, the fractional divider cells 100 of the group that are selectively activated and de-activated add to a contiguous chain of activated fractional divider cells 100. The input modulus control signal terminal 108 of the farthest downstream activated fractional divider cell 100 (called the "last activated fractional divider cell 100" herein) receives a logic one signal (i.e., the terminal 108 may be coupled to a logic one voltage) as long as the fractional divider cell 100 remains the last activated cell 100.

As a non-limiting example, one way to selectively activate and de-activate fractional divider cells 100 is through the use of the programming signals. More specifically, in accordance with an example implementation, a group of the most significant programming signals may be used to control a corresponding group of fractional divider cells 100. The most significant asserted programming signal corresponds to the last activated fractional divider cell 100, with downstream divider cells 100, if any, correspond to more significant programming signal(s) that are de-asserted. Thus, the most significant asserted programming signal establishes the length of the cascaded chain of activated fractional divider cells 100.

Figure 5:
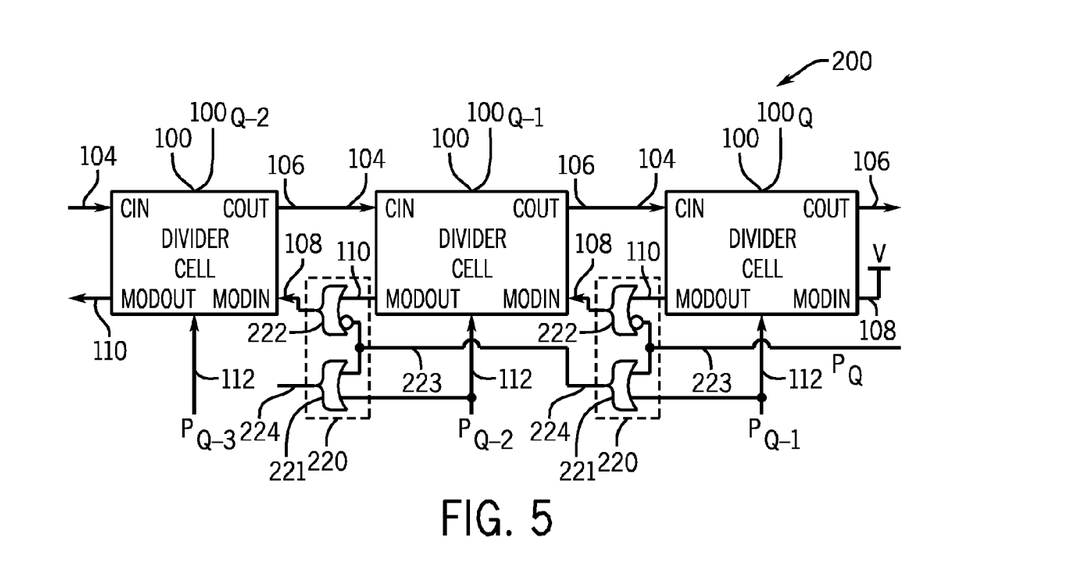
FIG. 5 is an illustration of circuitry to selectively activate and deactivate divider cells of the modular programmable divider according to an embodiment.

Referring to FIG. 5, the selectable activation and deactivation of the divider cells 100 may be accomplished through logic circuit 220 associated with each cell. Thus, for a given period of the reference input clock of the frequency synthesizer 50 (see FIG. 2), an associated number of the divider cells 100 are selectively activated to form a corresponding chain of activated cells containing the always active cells 100 and the activated cells of the activatable and deactivatable group cells. This means that the fractional divider cell 100 that is adjacent downstream to the last activated fractional divider cell 100 (i.e., the furthest downstream, or the lowest frequency activated fraction divider cell 100) provides a constantly asserted modulus control signal to the input modulus control signal terminal 108 of the last activated fractional divider cell 100.

FIG. 5 depicts the last three fractional divider cells $100_{Q-2}$, $100_{Q-1}$ and $100_Q$ of the programmable divider 80, and it assumed for this example, that at least these three fractional divider cells 100 are part of the group of cells 100 that may be selectively activated or de-activated, although this group may contain more than three cells 100 or less than three cells, depending on the particular embodiment. Except for the last fractional divider cell $100_Q$, each fractional divider cell of the selectively activated/de-activated group of cells 100 has associated logic circuit 220, which controls whether the input modulus control signal terminal 108 of the cell 100 receives a logic one voltage (thereby configuring the fractional divider cell 100 to be the last activated cell 100) or the modulus control signal from the output terminal 110 of the adjacent divider cell 100. As depicted in FIG. 5, the input modulus control signal terminal 108 of the last fractional divider cell $100_Q$ of the divider 80 is coupled to a logic one voltage.

The logic circuit 220 may have many different implementations, with a particular implementation being depicted in FIG. 5 as a non-limiting example. For this example, the logic circuit 220 includes two OR gates 221 and 222, which control, based on the programming signals, whether the input modulus control signal terminal 108 of the associated fractional divider cell 100 receives the MODOUT modulus control signal generated by the adjacent fractional cell 100 or receives a logic one voltage (for the case where the fractional divider cell 100 is the last active cell 100). The output terminal of the OR gate 222 is coupled to the input modulus control signal terminal 108 of the associated fractional divider cell 100, an input terminal of the OR gate 222 is coupled to the output modulus control signal terminal 110 of the adjacent fractional divider cell 100, and an inverted input terminal of the OR gate 222 is coupled to an input terminal of the OR gate 221 and a communication line 223. Another input terminal of the OR gate 221 is coupled to the input programming signal terminal 112 of the adjacent fractional divider cell 100, and an output terminal 224 of the OR gate 221 is coupled to a communication line 224 extending to the inverted input terminal of the OR gate 222 of the logic circuit 220 associated with the adjacent upstream fractional divider cell 100. For the logic circuit 220a associated with the fractional divider cell $100_{Q-1}$, the communication line 223 receives the $P_Q$ programming signal. However, for the other cells 100, the communication line 223 is coupled to the communication line 224 of the adjacent, upstream logic circuit 220.

Figure 6:
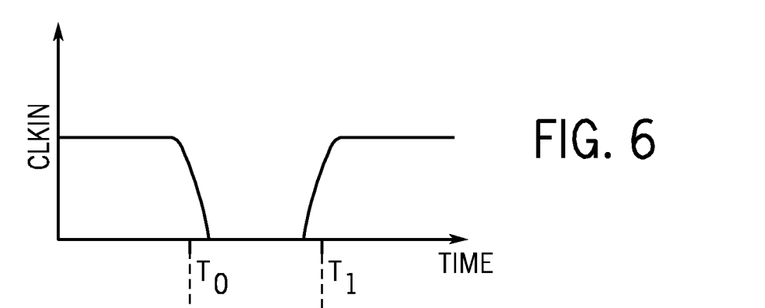
FIGS. 6, 7, 8 and 9 depict exemplary waveforms for signals of the last active frequency divider cell of a cascaded chain of active divider cells when the cell transitions from a deactivated state to an activated state according to an embodiment.
Figure 8:
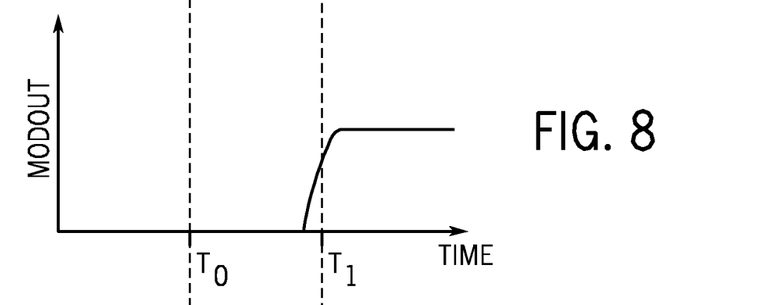
Figure 9:
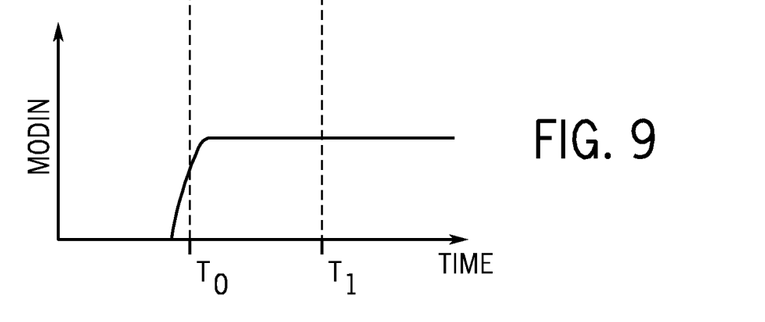

The activation and deactivation of the fractional divider cells 100 may introduce transient errors, which may, if appropriate measures are not undertaken, undesirably cause the modulus of the programmable divider 80 to depart from its programmed value. For example, referring to FIG. 4 in conjunction with FIGS. 6, 7, 8 and 9, after any transient errors have settled, the assertion of the MODIN input modulus control signal (FIG. 9) is synchronized to the falling edges of the CLK input clock signal; and the assertion of the MODOUT output modulus control signal (FIG. 8) is synchronized to the rising edges of the CLK input clock signal. As an example, FIGS. 6 and 9 depicted the assertion of the MODIN input modulus control signal at time $T_0$, which corresponds to the falling edge of the CLKIN input clock signal. For this example, the fractional divider cell 100 asserts the MODOUT output modulus control signal on the next rising edge of the CLKIN input clock signal at time $T_1$, as depicted in FIGS. 6 and 8.

Figure 7:
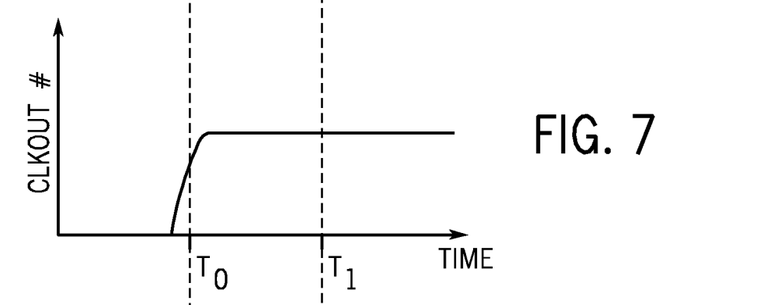

As depicted in FIG. 4, the fractional divider cell 100 generates the MODOUT output modulus control signal in response to the state of the complement or inverted CLKOUT output clock signal (called the "CLKOUT #" signal in FIG. 7). More specifically, the asserted state of the CLKOUT # signal (see FIG. 7) allows the fractional divider cell 100 to assert the MODOUT output modulus control signal. The state of the CLKOUT # output clock signal, therefore, is not insignificant when the fractional divider cell 100 is activated. However, when the fractional divider cell 100 is first activated, if appropriate measures are not otherwise undertaken, as disclosed herein, the CLKOUT # output clock signal of the fractional divider cell 100 may be in an undetermined state; and due to this undetermined state, the fractional divider cell 100 may miss one assertion of the MODOUT output modulus control signal, thereby causing the programmed modulus of the programmable divider 80 to deviate from its programmed value. Therefore, in accordance with embodiments disclosed herein, the CLKOUT # output clock signal of the divider cell 100 is placed in a known, or predetermined, state (an asserted or logic one state, for example) when the fractional divider cell 100 transitions from a deactivated state to an activated state.

Figure 10:
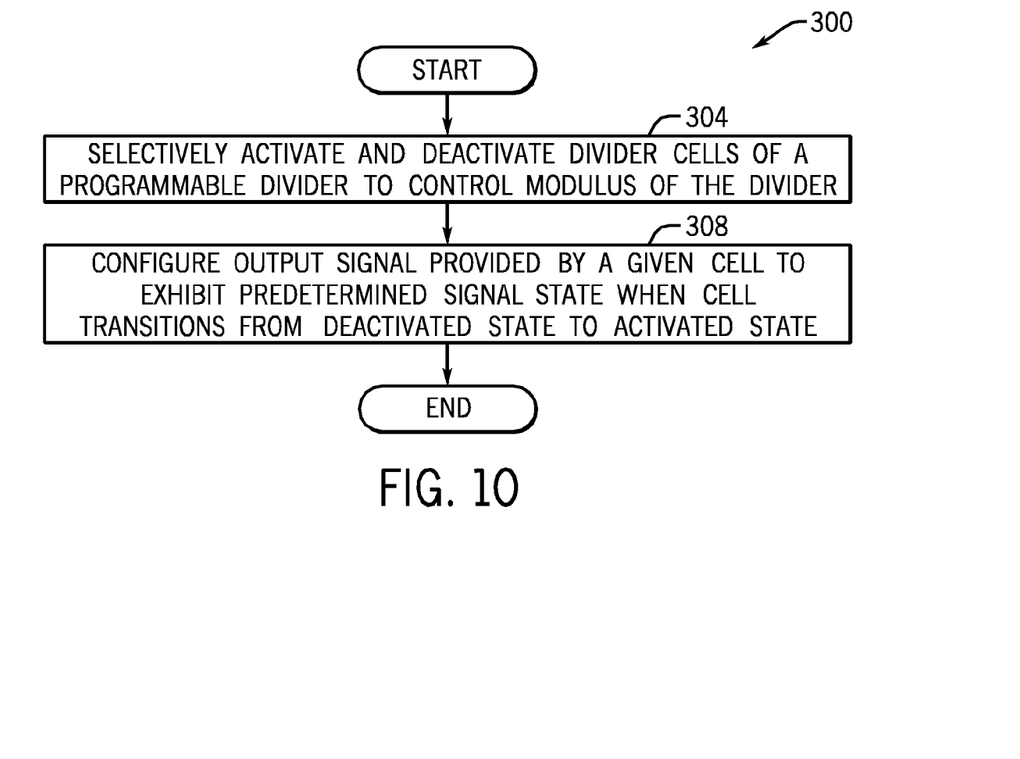
FIG. 10 is a flow diagram depicting a technique to regulate an output signal of the last active frequency divider cell of a cascaded chain of active divider cells when the cell transitions from a deactivated state to an activated state according to an embodiment

Therefore, referring to FIG. 10, in accordance with some exemplary embodiments, a technique 300 includes selectively activating and deactivating divider cells of a programmable divider to control a modulus of the divider, pursuant to block 304. The output signal that is provided by a given cell is configured (block 308) to exhibit a predetermined signal state when the cell transitions from a deactivated state to an activated state.

Figure 11:
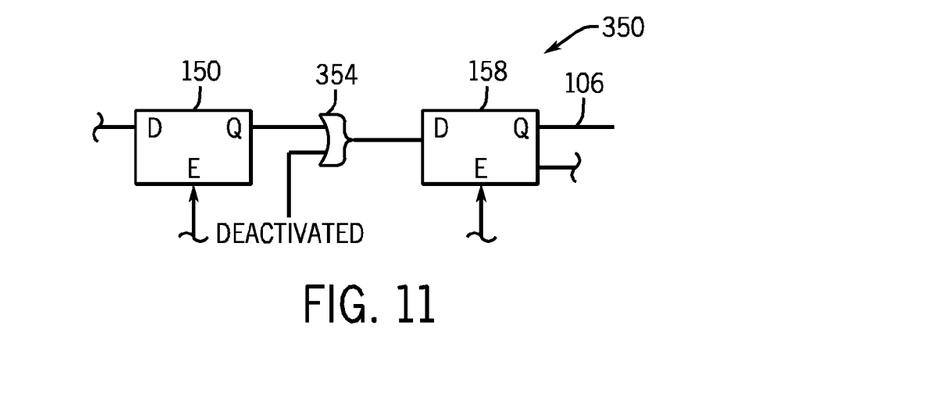
FIG. 11 is an illustration of circuitry to regulate an output signal of the last active frequency divider cell of a cascaded chain of active divider cells when the cell is activated according to an embodiment.

Referring to FIG. 11, as a non-limiting example, an exemplary circuit 350 to control the signal state of a given fractional divider cell 100 may include an OR gate 354 that is coupled between the non-inverting output terminal of the flip-flop 150 and the input terminal of the latch 158. In this regard, one input terminal of the OR gate 354 is coupled to the non-inverting output terminal of the flip-flop 150 and the other input terminal of the OR gate 354 receives a signal (called "DEACTIVATED" in FIG. 11) that when asserted (driven to a logic one value, for example) indicates that the divider cell 100 is deactivated. As a non-limiting example, this signal may be generated on an output terminal 144 of a controller 140 (see FIG. 3) of the programmable divider 80. For example, the controller 140 may receive the $P'_0$ to $P'_Q$ programming signals and may assert the DEACTIVATED signal when the fractional divider cell 100 is deactivated to cause the latch 158 to de-assert the CLKOUT # output clock signal (i.e., drive the CLKOUT # signal to a logic one state) while the divider cell 100 is deactivated. In an alternative exemplary embodiment, instead of using a circuit such as the OR gate 354, the DEACTIVATED signal may be received by a SET input of the latch 158 to asynchronously de-assert the CLKOUT # signal upon deactivation of the fractional divider cell 100.

Another potential error may be introduced to the programmed modulus when a given fractional divider cell 100 is activated due to the MODIN input modulus control signal to the cell 100 being initially synchronized to a clock signal other than the CLKIN input clock signal that is received by the cell 100. More specifically, during its normal operation, the MODOUT output modulus control signal changes with to the falling edge of the CLKIN input clock signal. However, when a fractional divider cell 100 upstream of a given fractional divider cell 100 (such as fractional divider cell 100$_{N+1}$) is activated, the MODIN input modulus control signal to the cell 100$_N$ may be temporarily synchronized to a clock signal (such as the MODOUT output clock signal of the divider cell 100, for example) other than the CLKIN input clock signal due to the programming of the divider 80. Due to the momentary synchronization of the MODIN signal to this other clock signal, a glitch may be introduced, which causes the actual modulus of the programmable divider 80 to deviate from its programmed value.

Figure 12:
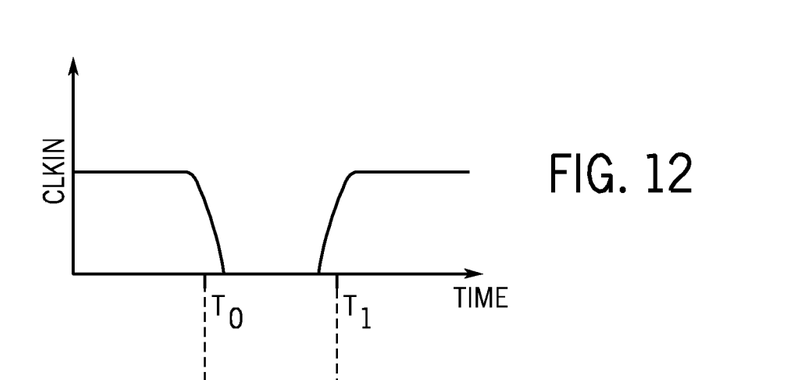
FIGS. 12, 13 and 14 are waveforms illustrating a potential glitch due to a modulus control signal being temporarily synchronized to a clock signal used to effect a programming change.
Figure 13:
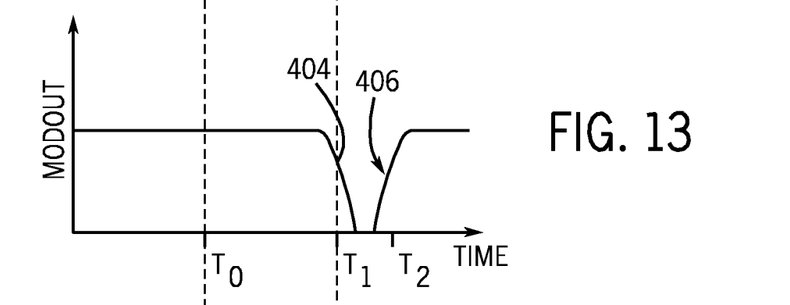
Figure 14:
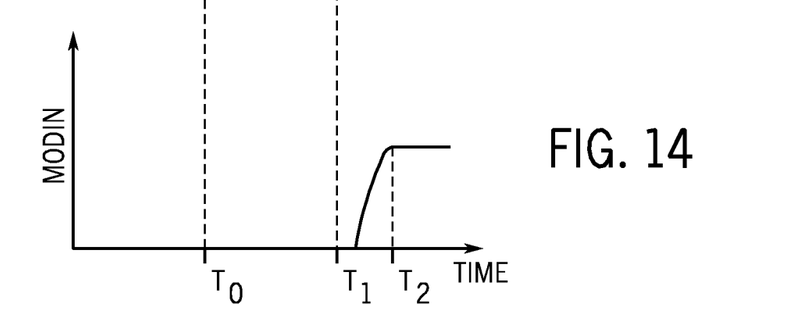

More specifically, as an example of a potential glitch, the update of the $P_0$ to $P_Q$ programming signals may be synchronized to the falling edge of the MODOUT output clock signal. The potential glitch is illustrated in FIGS. 12, 13 and 14 for a fractional divider cell 100 that receives a MODOUT output clock signal from a divider cell 100$_{N+1}$, which was just activated. This means that the MODIN input modulus control signal to the divider cell 100$_N$ is not in synchronization with the CLK input clock signal.

For the following illustration, it is assumed that the programmable divider 80 uses the MODOUT output clock signal of the fractional divider cell 100$_N$ to clock the register 130, which furnishes the programming signals to all of the fractional divider cells 100 of the programmable divider 80. In other words, the REG_CLK clock signal is the MODOUT output clock signal (see FIG. 3), i.e., synchronizes the furnishing of a new set of programming signals to the divider cells 100.

As depicted in FIG. 12, for this example, at time $T_1$, the CLKIN input clock signal is asserted, which causes the fractional divider cell 100$_N$ to de-assert the MODOUT output modulus control signal at time $T_1$. Because the programming signals provided by the register 130 (FIG. 3) are synchronized to a falling edge 404 of the MODOUT signal, the upstream and now activated fractional divider cell 100$_{N+1}$ asserts the MODIN input modulus control signal at time $T_2$, as depicted in FIG. 14. However, at time $T_2$, the latch 160 (see FIG. 4) that generates the MODOUT output modulus control signal for the cell 100$_N$ is in its transparent state, thereby corrupting the MODOUT signal, as shown at reference numeral 406 in FIG. 13. This glitch may cause the asserted state of the MODIN modulus control signal to be missed, thereby introducing an error for the programmed modulus for the programmable divider 80.

Figure 15:
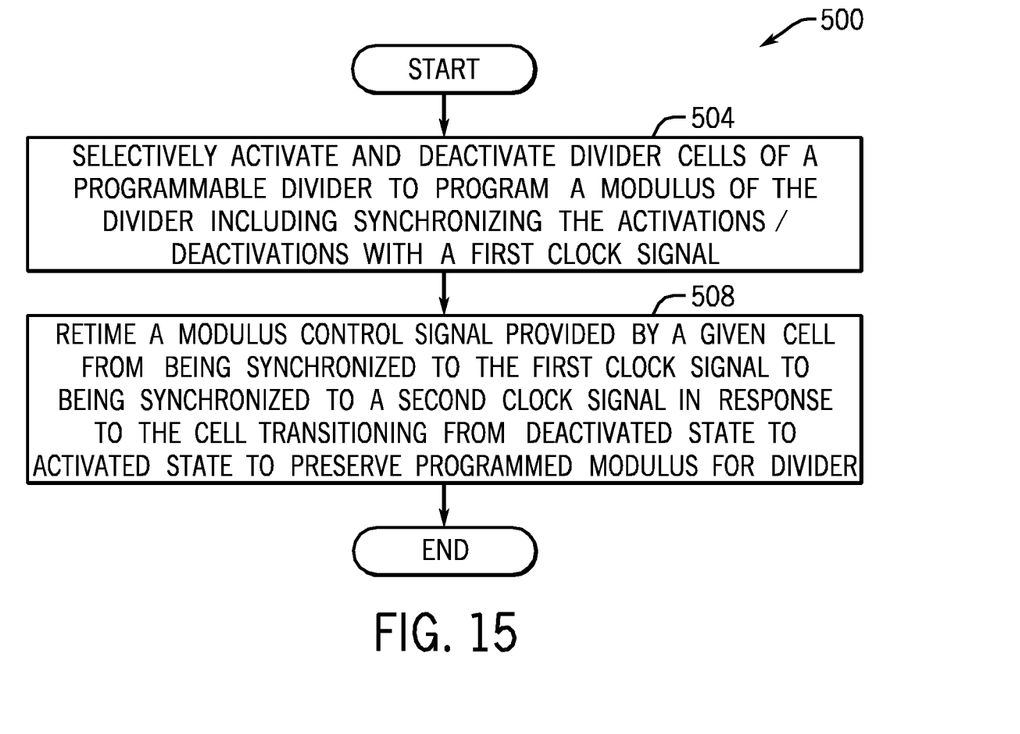
FIG. 15 is a flow diagram depicting a technique to retime a modulus control signal provided by a fractional divider cell when the cell transitions from a deactivated state to an activated state according to an embodiment.

Therefore, in accordance with embodiments of the invention disclosed herein, the programmable divider 80 retimes the MODIN input modulus control signal provided to a given fractional divider cell 100, when the adjacent upstream fractional divider cell 100 is activated so that the MODIN input modulus control signal is synchronized to the CLKIN input clock signal. In this manner, referring to FIG. 15, in a technique 500, divider cells of a programmable divider are selectively activated and deactivated, pursuant to block 504 to program a modulus of the divider, and this activation and deactivation including synchronizing the activation/deactivation with a first clock signal. The technique 500 includes retiming a modulus control signal that is provided by a given divider cell 100 from being synchronized to the first clock signal to being synchronized to a second clock signal in response to the cell transitioning from a deactivated to an activated state to preserve a programmed modulus for the programmable divider 80.

Figure 16:
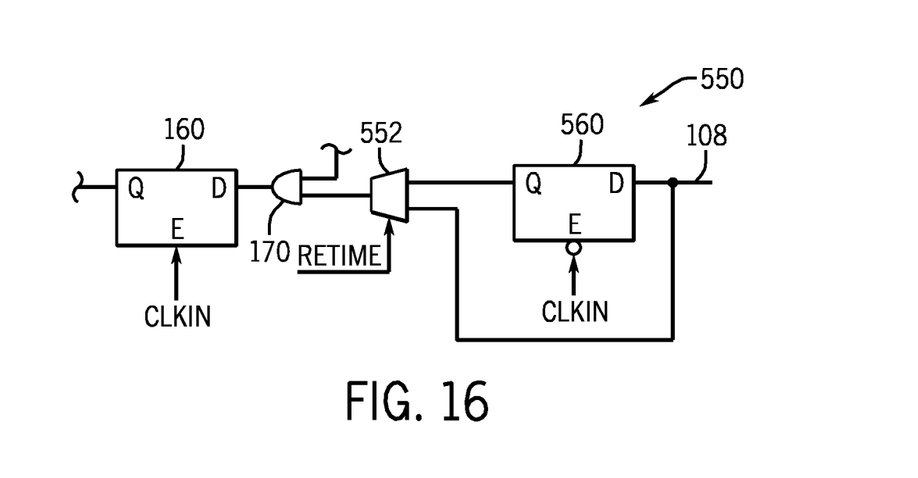
FIG. 16 is a schematic diagram of a circuit to retime a modulus control signal provided by a fractional divider cell when the cell transitions from a deactivated state to an activated state according to an embodiment.

FIG. 16 depicts an exemplary circuit 550 for retiming the MODIN modulus input control signal in accordance with an embodiment, which modifies the circuitry of the fractional divider cell 100 depicted in FIG. 4. Referring to FIG. 16 in conjunction with FIG. 4, in general, the circuit 550 includes a D-type latch 560 that includes an enable input terminal that receives the inverted CLKIN input clock signal. The input terminal of the latch 560 is coupled to the input modulus control signal terminal 108. The non-inverting output terminal of the latch 560 is coupled to one terminal of a multiplexer 552, another input of the multiplexer is coupled to the terminal 108. The output terminal of the multiplexer 552 is coupled to an input terminal of the AND gate 170.

The multiplexer 552 is controlled by a signal called "RETIME," which may be provided by the controller 140 (see FIG. 2). The controller 140 asserts (drives high, for example) RETIME signal is asserted when the upstream fractional divider cell 100 is first activated and is otherwise de-asserted. Thus, during normal operation, the MODOUT signal is produced by the upstream divider cell. However, when the RETIME signal is asserted during the activation of the upstream fractional divider cell 100, the MODIN signal is retimed with the CLKIN signal.

While a limited number of examples have been disclosed herein, those skilled in the art, having the benefit of this disclosure, will appreciate numerous modifications and variations therefrom. It is intended that the appended claims cover all such modifications and variations.

What is claimed is:

1. A method comprising:
    controlling a modulus of a programmable divider, the controlling comprising selectively activating and deactivating a plurality of cells of the divider, each cell of the plurality of cells being programmable by an associated at least one programming signal to cause the cell to divide by one of multiple moduli;
    wherein the activating comprises, for at least one of the cells, configuring an output signal of the cell to exhibit a predetermined signal state to override a response of the cell to the associated at least one programming signal when the cell transitions from a deactivated state to an activated state;
    wherein the controlling further comprises retiming a modulus control signal received by the at least one cell from being synchronized from a first clock signal to being synchronized to a second clock signal other than the first clock signal.

2. The method of claim 1, wherein the output signal comprises a frequency divided clock signal, the method further comprising using the frequency divided clock signal to generate a modulus control signal for another cell of the divider.

3. The method of claim 1, further comprising controlling the modulus of the programmable divider to regulate a period of a signal furnished by a synthesizer.

4. The method of claim 3, wherein the controlling the modulus to regulate the frequency of the synthesizer comprises updating the modulus of the programmable divider each period of a reference clock signal.

5. The method of claim 1, wherein the plurality of cells comprise a subset of cells of a larger group of cells of the programmable divider.

6. The method of claim 1, wherein the cells comprise fractional divider cells.

7. The method of claim 1, further comprising synchronizing programming of the divider with the first clock signal.

8. The method of claim 1, wherein the second clock signal comprises a clock signal received by the at least one cell and the second clock signal comprises a clock signal produced by the at least one cell.

9. An apparatus comprising:
    a programmable divider comprising divider cells, at least a subset of the divider cells being adapted to be selectively activated and deactivated in synchronization with a first clock signal to program a modulus of the programmable divider; and
    a controller to, in response to a given divider cell of the divider cells transitioning from a deactivated state to an activated state, retime a modulus control signal provided by the given divider cell from being synchronized to the first clock signal to being synchronized to a second clock signal.

10. The apparatus of claim 9, wherein the given divider cell comprises the last divider cell of a cascaded chain of activated divider cells.

11. The apparatus of claim 9, wherein the second clock signal comprises a clock signal received by a divider cell downstream of the given divider cell.

12. The apparatus of claim 9, further comprising a sigma delta modulator to provide programming signals to the divider cells.

13. The apparatus of claim 9, wherein the divider cells comprise fractional divider cells cascaded together.

14. An apparatus comprising:
    a programmable divider comprising divider cells, at least a subset of the divider cells being adapted to be selectively activated and deactivated to program a modulus of the programmable divider, each cell of the subset of the divider cells being programmable by an associated at least one programming signal to cause the cell to divide by one of multiple moduli;
    a controller to configure an output signal of at least one of the divider cells of the subset of divider cells to exhibit a predetermined signal state to override a response of the cell to the associated at least one programming signal when the cell transitions from a deactivated state to an activated state; and
    a sigma delta modulator to provide programming signals to the divider cells to program the modulus of the programmable divider to regulate a period of a signal provided by a synthesizer.

15. The apparatus of claim 14, wherein the output signal comprises a frequency divided clock signal, and the at least one divider cell is adapted to generate a modulus control signal in response to the output signal.

16. The apparatus of claim 14, wherein the divider cells comprise fractional divider cells cascaded together.

17. The apparatus of claim 16, wherein at least one of the divider cells is adapted to divide a clock frequency of a clock signal received by the at least one cell from another cell, receive a modulus control signal to control a modulus applied by the at least one cell and transmit a modulus control signal to control a modulus applied by another one of the cells.

* * * * *